(12) United States Patent
Drakhlis et al.

(10) Patent No.: US 7,332,977 B2
(45) Date of Patent: Feb. 19, 2008

(54) CRYSTAL CLOCK GENERATOR OPERATING AT THIRD OVERTONE OF CRYSTAL'S FUNDAMENTAL FREQUENCY

(75) Inventors: Boris Drakhlis, Mountain View, CA (US); Wing Faat Liu, San Jose, CA (US); Craig M. Taylor, Pleasanton, CA (US); Tony Yeung, Milpitas, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 239 days.

(21) Appl. No.: 11/306,262

(22) Filed: Dec. 21, 2005

(65) Prior Publication Data

US 2007/0069826 A1    Mar. 29, 2007

Related U.S. Application Data

(63) Continuation of application No. 10/710,549, filed on Jul. 20, 2004, now Pat. No. 7,002,423.

(51) Int. Cl.
*H03B 27/00* (2006.01)
(52) U.S. Cl. .............................. 331/46; 331/49; 331/53; 331/158; 331/116 R; 331/116 FE; 331/74
(58) Field of Classification Search ................ 331/46, 331/158, 116 R, 116 FE, 74, 45, 49, 53
See application file for complete search history.

(56) References Cited

U.S. PATENT DOCUMENTS

| 4,144,747 | A  | * | 3/1979 | Datwyler, Jr. ............ 73/862.59 |
| 6,249,190 | B1 | * | 6/2001 | Rozenblit et al. ............. 331/46 |
| 7,088,188 | B2 | * | 8/2006 | Fredriksson ................. 331/46 |

* cited by examiner

*Primary Examiner*—Arnold Kinkead
(74) *Attorney, Agent, or Firm*—Stuart T. Auvinen; g Patent LLC

(57) ABSTRACT

A crystal oscillator operates at the third overtone of the crystal's fundamental frequency. A value of a shunt resistor between the two phase-shift leg nodes is chosen so that the absolute value of the product $gm \times (Xc1) \times (Xc2)$ is greater than the effective reactance of the crystal, where gm is the gain of the amplifier attached to the phase-shift legs, and Xc1 and Xc2 are the effective capacitive reactances of phase-shift legs at nodes X1 and X2. The third overtone is doubled by a multiplier and the final output filtered to remove the third overtone and select a frequency six times the fundamental frequency. A pair of Colpitts or Pierce amplifier half circuits is attached to the phase-shift leg nodes. The leg nodes can be capacitively isolated from Pierce-amplifier circuit nodes to improve start-up. Frequency doubling can be performed by summing currents from the two oscillator half circuits.

17 Claims, 9 Drawing Sheets

CRYSTAL CLOCK GENERATOR OPERATING AT THIRD OVERTONE OF CRYSTAL'S FUNDAMENTAL FREQUENCY

RELATED APPLICATION

This is a continuation of U.S. Ser. No. 10/710,549, filed Jul. 20, 2004, now U.S. Pat. No. 7,002,423.

FIELD OF THE INVENTION

This invention relates to crystal oscillators, and more particularly to oscillator circuits creating even-harmonics of odd-overtones.

BACKGROUND OF THE INVENTION

Digital systems rely on precise clocks for sequencing among operating states. Higher-speed systems have required faster and faster clock rates. Crystal oscillators are often used to generate these clocks. A piezoelectric effect causes a crystal such as quartz to vibrate and resonate at a particular frequency. The quartz crystal naturally oscillates at a particular frequency, its fundamental frequency that can be hundreds of megahertz.

The frequency of oscillation can be adjusted somewhat by adjusting the voltage bias to a varactor on the crystal's terminals. However, frequency adjustment is much less than 1 percent. Such voltage-controlled crystal oscillators (VCXO) are popular for their ease of output-frequency adjustment.

Very high-speed systems may require clocks that are faster than the fundamental clock rates of commonly-available crystal oscillators. Sometimes the clock output can be multiplied, such as by using a phase-locked loop (PLL). However, the feedback within the PLL can limit performance or cause distortions or other effects and costs can increase.

The fundamental frequency of oscillation of the crystal may be limited by various factors, such as the geometry of the crystal. Higher frequencies may require thinner crystals that are much more expensive to manufacture. Thus crystals are currently limited to frequencies of less than 200 MHz for inexpensive crystals, or 500 MHz for expensive crystals.

Prior-art ceramic coaxial resonators achieve higher-frequency operation essentially by physically dividing the resonator in half. Since the frequency of resonance is set by the coaxial length, the output frequency is doubled with the halving of the resonance element. In contrast, crystal oscillators are fabricated from synthetic quartz material. Such a Bulk Acoustic Wave (BAW) crystal oscillator has a resonating frequency determined by its thickness. Unlike coaxial resonators, BAW crystal oscillators have higher resonating frequency modes, or overtones, that are inherent within the BAW element. Such overtones are strictly limited to odd integer multiples.

For optimum frequency stability and low phase noise, BAW crystal oscillators having a high quality (Q) factor are more desirable that coaxial resonators with lower Q factors. However, BAW crystal oscillators typically operate at much lower frequencies than coaxial resonators.

What is desired is a crystal oscillator that outputs a faster clock than the fundamental frequency of the crystal. A crystal oscillator circuit that operates at odd harmonic multiples of the fundamental crystal frequency is desirable. A crystal oscillator that operates at the third overtone and then has its output doubled to produce a 6× output is desired.

DETAILED DESCRIPTION

The present invention relates to an improvement in crystal oscillator circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
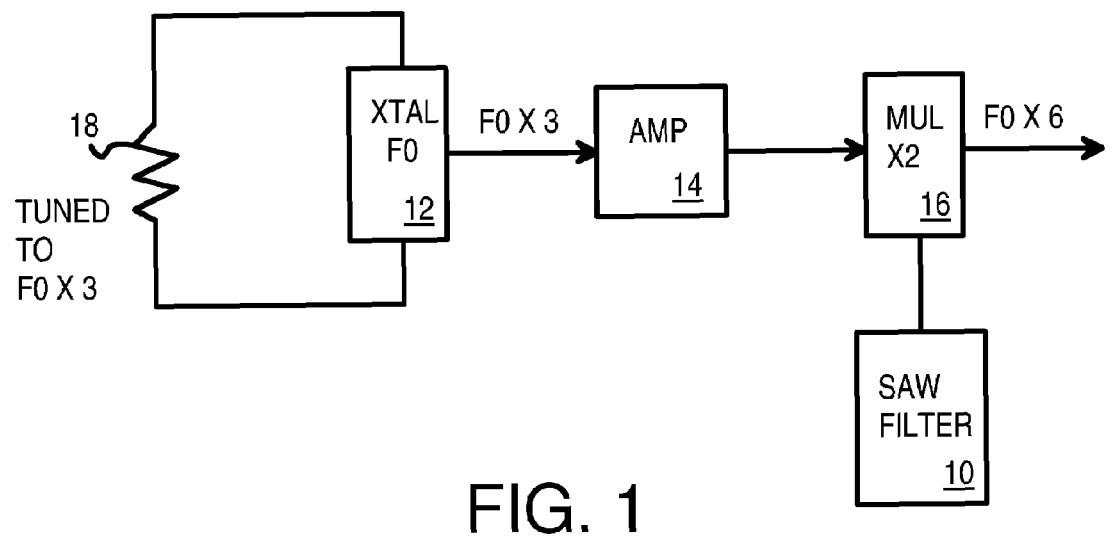
FIG. 1 is a block diagram of a crystal oscillator operating at the third overtone of the crystal's fundamental frequency.

FIG. 1 is a block diagram of a crystal oscillator operating at the third overtone of the crystal's fundamental frequency. Crystal 12 has a fundamental frequency F0 that it exhibits resonance at. The absolute impedance of crystal 12 is at a minimum at frequency F0. However, other overtones of this fundamental frequency are also produced by crystal 12. Tuning resistor 18 has a resistance value that is chosen to suppress or attenuate signals from crystal 12 that are at the fundamental frequency F0, while not attenuating signals as much at the third overtone of F0, or 3×F0.

Amplifier 14 receives the signal from crystal 12, which is primarily the third overtone 3×F0. Amplifier 14 amplifies the third overtone signal and drives an amplified 3×F0 signal to multiplier 16. Multiplier 16 doubles the frequency of the amplified signal, outputting a signal that is six times the fundamental of crystal 12, or 6×F0. Amplifier 14 and multiplier 16 can be combined into one circuit item that performs both functions. Surface-acoustic-wave (SAW) filter 10 improves the quality of the signal from multiplier 16. Other filters such as LC or RC filters could be substituted.

The output of crystal 12 is attenuated at F0, so the output signal from crystal 12 is primarily at the third overtone 3×F0 rather than at the fundamental F0. The value of tuning resistor 18 is set so that the absolute value of the product gm×Xc1×Xc2 is greater than the effective impedance of crystal 12, where gm is the gain of amplifier 14, and Xc1 and Xc2 are the effective reactances of the equivalent phase-shift capacitances present in the oscillator circuit. For example, tuning resistor 18 can have a value of 4.5 K-ohms for a fundamental frequency of 16-28 MHz in some embodiments.

Figure 2:
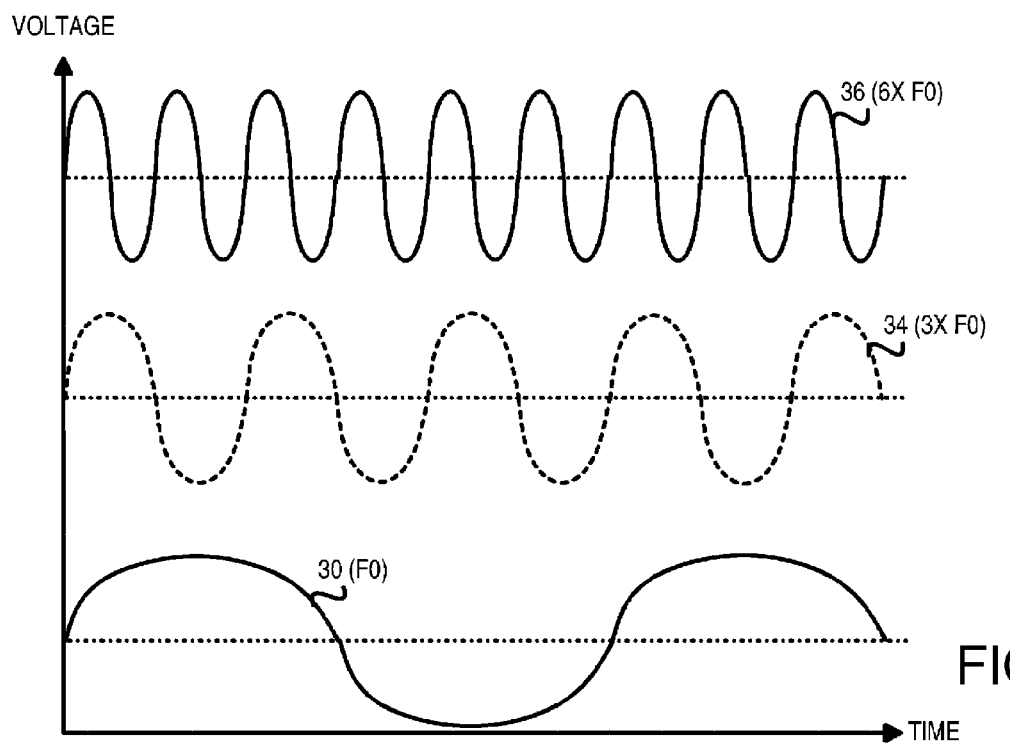
FIG. 2 is a graph showing signal waveforms of the third-overtone crystal oscillator.

FIG. 2 is a graph showing signal waveforms of the third-overtone crystal oscillator. The crystal has a fundamental frequency of F0. This fundamental signal 30 is suppressed, so that the third overtone signal 34 is encouraged. Third overtone signal 34 is amplified and multiplied by 2 to generate output signal 36, which is six times the fundamental frequency. The peak-to-peak voltage of the waveforms is about 2V.

For example, crystal 12 can have a 20 MHz fundamental operating frequency. It third overtone is at 60 MHz. The output frequency is finally doubled to 120 MHz. Thus a 120-MHz output is generated from a 20-MHz crystal.

Figure 3:
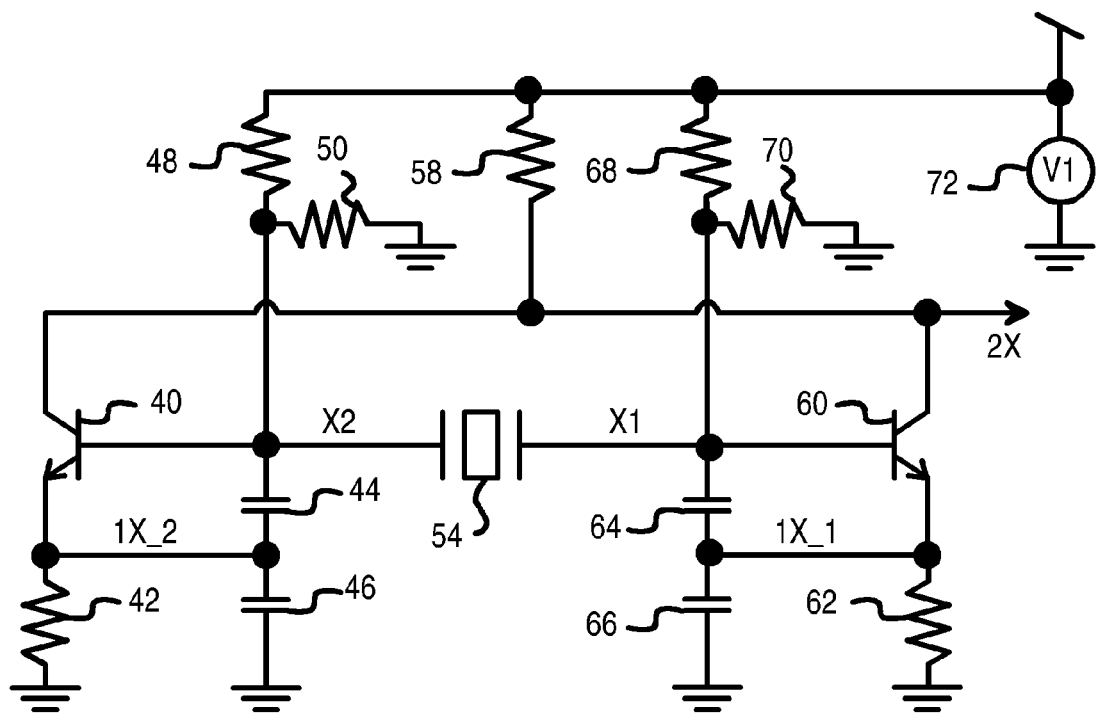
FIG. 3 is a schematic of a crystal oscillator operating at its third overtone.

FIG. 3 is a schematic of a crystal oscillator operating at its third overtone. The circuit is based on a push-push Colpitts oscillator that drives both ends of crystal 54. Crystal 54 has a fundamental operating frequency of F0, and a third overtone of 3×F0. The fundamental is suppressed by the tuning resistor (not shown) across nodes X1, X2, and the entire circuit performs the tasks of both third overtone amplification/operation and multiplication leaving the 6×F0 signal as the predominant output signal.

The bi-directional input/outputs X1, X2 of crystal 54 are applied to the base of NPN transistors 40, 60. The collectors (node 2X) of transistors 40, 60 are biased by biasing resistor 58 from V1 voltage source 72. The base of transistor 40 is biased by a voltage divider of resistors 48, 50 between V1 and ground, while the base of transistor 60 is DC-biased by a voltage divider of resistors 68, 70 between V1 and ground. Current sources could also be used in place of voltage dividers.

Emitter resistors 42, 62 sink the DC current passing through transistors 40, 60, respectively. Base-emitter capacitor 44 is between crystal node X2, the base of transistor 40, and node 1 X_2, the emitter of transistor 40. Output capacitor 46 is between emitter node 1X_2 and ground. Capacitors 44, 46 provide the required phase shift necessary for oscillation. Crystal nodes X1, X2 can also be considered phase-shift legs or input nodes.

The ratio of capacitors 44, 46 determines start-up time delays and gain margin. Typical values are 11 pF and 32 pF for capacitors 44, 46, respectively, but other values are possible.

Likewise, base-emitter capacitor 64 is between crystal node X1, the base of transistor 60, and node 1X_1, the emitter of transistor 60. Output capacitor 66 is between emitter node 1X_1 and ground.

When power-supply voltage V1 is 3.3 volts, the collectors, node 2X, which operates at double the frequency of nodes X1, X2, can be biased to 2.9 volts by a 200-ohm biasing resistor 58, while crystal nodes X1, X2 are DC-biased to 1.25 volts. The emitters are at about 0.5 volts, the P-N junction turn-on voltage. Resistors 48, 68 can be 15 K-ohm, resistors 50, 70 have 10 K-ohm resistance, and resistors 42, 62 are 510-ohm resistors. Base-emitter capacitors 44, 64 can each be 11 pF and output capacitors 46, 66 can each be a 32 pico-Farad. Other values can be substituted. Capacitors 44, 64 each result in Xc1. Likewise, capacitors 46, 66 each result in Xc2. The amplifiers formed by 40, 42, 48, 50, 58 and 60, 62, 68, 70, 58 each create gain gm.

The frequency-doubling oscillator uses two overtone crystal oscillator circuits oscillating at the third overtone of the crystal. One oscillator circuit includes transistor 40 while the other oscillator circuit includes transistor 60. The outputs of the two oscillator circuits are combined at collector node 2X, such that the overtone frequencies are subtracted while the doubled frequencies are added. The doubling of the frequencies occurs because of the nonlinearities in the active devices within the two oscillators. The current through summing resistor 58 is a sum of currents through transistors 40 and 60. These transistors 40, 60 are operating in a non-linear mode. Each half of the oscillator generates a third overtone (3OT) current that is 180° relative to the other half. Those currents subtract at collectors (or drains) of transistors 40, 60, node 2X, so there is no 3OT voltage across summing resistor 58. The currents at double the frequency of the 3OT are in phase, so they add at summing resistor 58. As a result there is a six times the crystal fundamental frequency (6×F0) voltage across summing resistor 58.

The output from the oscillator can be taken as differential signals 1X_2 and 1X_1, the signals combined together, amplified, filtered, and buffered. The resultant frequency is double the third overtone of crystal 54. Tuning resistor 18 (not shown) can be added between nodes X1 and X2. Likewise, an inductor circuit can be added between nodes X1 and X2 to select the third overtone of the crystal.

While bipolar transistors are useful for discrete circuit implementations or more expensive bipolar processes, an integrated oscillator can use more-readily manufactured complementary metal-oxide-semiconductor (CMOS) transistors.

Figure 4:
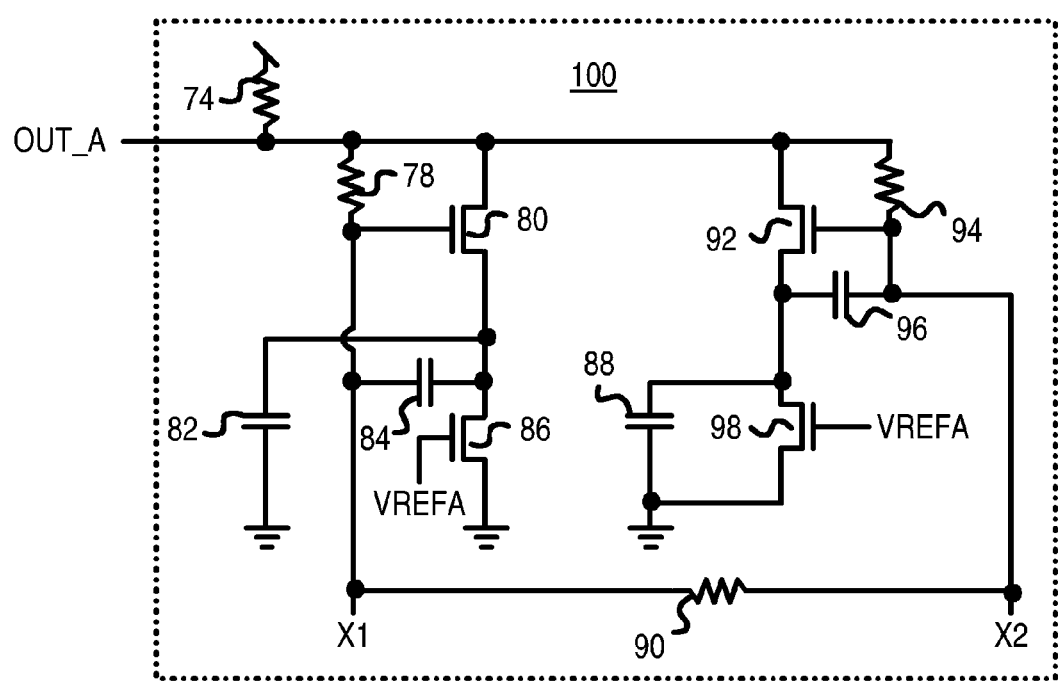
FIG. 4 is a schematic of a CMOS Colpitts oscillator for operating at the third overtone of the crystal.

FIG. 4 is a schematic of a CMOS Colpitts oscillator for operating at the third overtone of the crystal. Differential core 100 connects to the crystal at nodes X1 and X2. Tuning or shunt resistor 90 across the crystal has a resistance value that suppresses the fundamental signal from the crystal while passing the third overtone. Shunt resistor 90 can have a value of 4.5 K-ohm for a fundamental-frequency of 16-28 MHz and a third overtone of 50-65 MHz in one embodiment, but other values can be used in some embodiments. The value of shunt resistor 90 is chosen so that the absolute value of the product gm×(Xc1)×(Xc2) is greater than the effective impedance of the crystal, where gm is the gain of each amplifier in core 100, and Xc1 and Xc2 are the effective capacitive reactances of each phase-shift-leg of each amplifier connected to crystal nodes X1 and X2. Shunt resistor 90 effectively reduces the Q factor of the crystal for the fundamental frequency, causing the 3rd overtone frequency to have the required Q factor.

The drains of n-channel differential transistors 80, 92 are connected together as output node OUT_A. The bias voltage of output node OUT_A is set by bias resistor 94 to power which also acts as the summing resistor. Current from node OUT_A passes through differential transistor 80 and n-channel sink transistor 86 to ground, and through differential transistor 92 and n-channel sink transistor 98 to ground to set the bias voltage of output node OUT_A. The bias voltage of output OUT_A can be about 2.97 volts. The gates of n-channel sink transistors 86, 98 are driven by bias voltage VREFA, which is generated in FIG. 5.

The voltage bias to crystal nodes X1, X2 are set by bias resistors 78, 94 to output node OUT_A. The gate voltage is about 2.7 volts. Bias resistors 78, 94 set the channel current for transistors 80, 92. Bias resistors 78, 94 can have a value of 200 K-ohm when bias resistor 74 is a 100-ohm resistor.

The gate of n-channel differential transistor 80 receives crystal node X1, while the gate of n-channel differential transistor 92 receives crystal node X2. Gate-to-source capacitor 84 couples the gate and source of differential transistor 80. Capacitor 96 couples the gate and source of differential transistor 92. Capacitors 84, 96 are analogous to capacitors 44, 64 of FIG. 3 and are Colpitts capacitors. Capacitors 84, 96 provide first or initial phase shift and regenerative feedback into the oscillator amplifier. These capacitors can have a value of 10 pF.

Capacitors 82, 88 are coupled between the sources of differential transistors 80, 92 respectively, and ground. They are analogous to capacitors 46, 66 in FIG. 3 and are Colpitts capacitors, providing a second or additional phase shift and can have a value of 32 pF. Operation of the circuit is similar to that described before for FIG. 3, except that CMOS rather than bipolar transistors are used.

Figure 5:
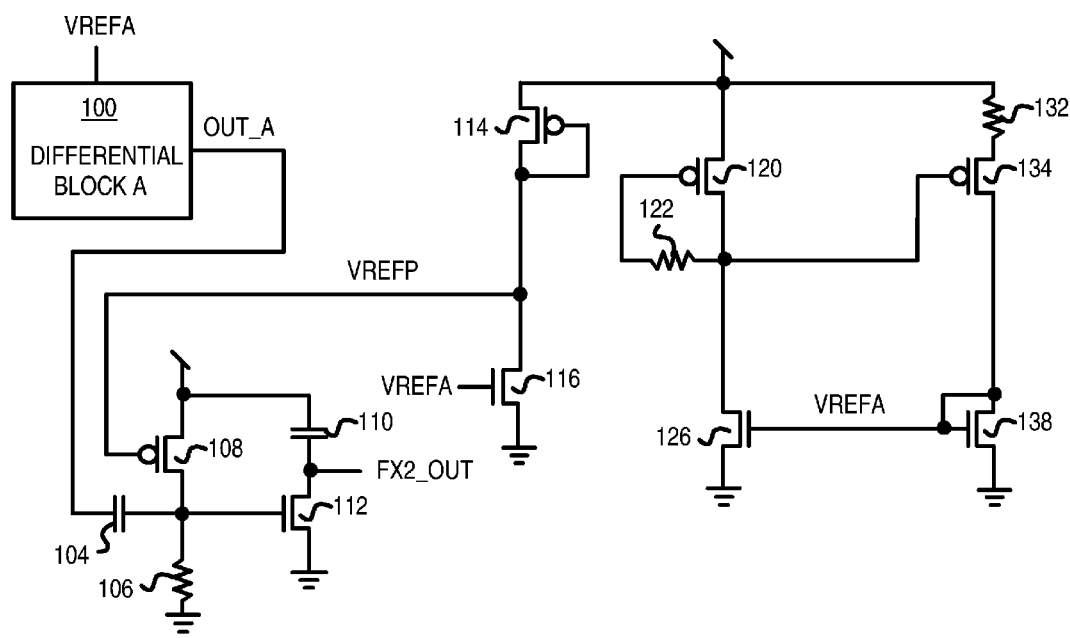
FIG. 5 shows output and biasing circuits for the differential core of FIG. 4.

FIG. 5 shows output and biasing circuits for the differential core of FIG. 4. Differential core 100 drives the crystal to select the third overtone rather than the fundamental frequency. Output OUT_A from differential core 100 is filtered of DC components by DC-filtering capacitor 104, and the AC components of the output are applied to the gate of n-channel output transistor 112. The DC bias of the gate node is set by p-channel bias transistor 108, which has its gate driven by bias voltage VREFP, and pull-down resistor 106, which form a voltage divider.

The drain of output transistor 112 drives output capacitor 110, which can be a 16 pF capacitor between output node FX2_OUT and power. Output node FX2_OUT has a frequency of 6×F0. The capacitance C of the L-C tank circuit is provided by tank capacitor 110, while the inductance L can be provided externally across tank capacitor 110. The tank circuit purifies the 6×F0 output.

Reference voltage VREFA is generated by the gate and drain of n-channel bias-generating transistor 138. Current is supplied to bias-generating transistor 138 by resistor 132 and p-channel transistor 134. P-channel transistor 120 and n-channel transistor 126 have their drains connected together and drive the gate of p-channel transistor 134.

Feedback across the gate and drain of p-channel transistor 120 is provided through resistor 122. Transistors 120, 126, 134, 138 are a biasing circuit for oscillator core 100, generating VREFA, while transistors 114, 116 generate VREFP. Transistors 120, 134 are biased in the weak inversion region. The four transistors 120, 126, 134, 138 are interconnected as a closed loop with resistor 122 providing feedback, and the current is related to the loop gain and resistor 132.

Reference voltage VREFP is generated by p-channel transistor 114, which has its gate and drain connected together. N-channel transistor 116 sinks the drain current from p-channel transistor 114, and has its gate driven by reference voltage VREFA.

Figure 6:
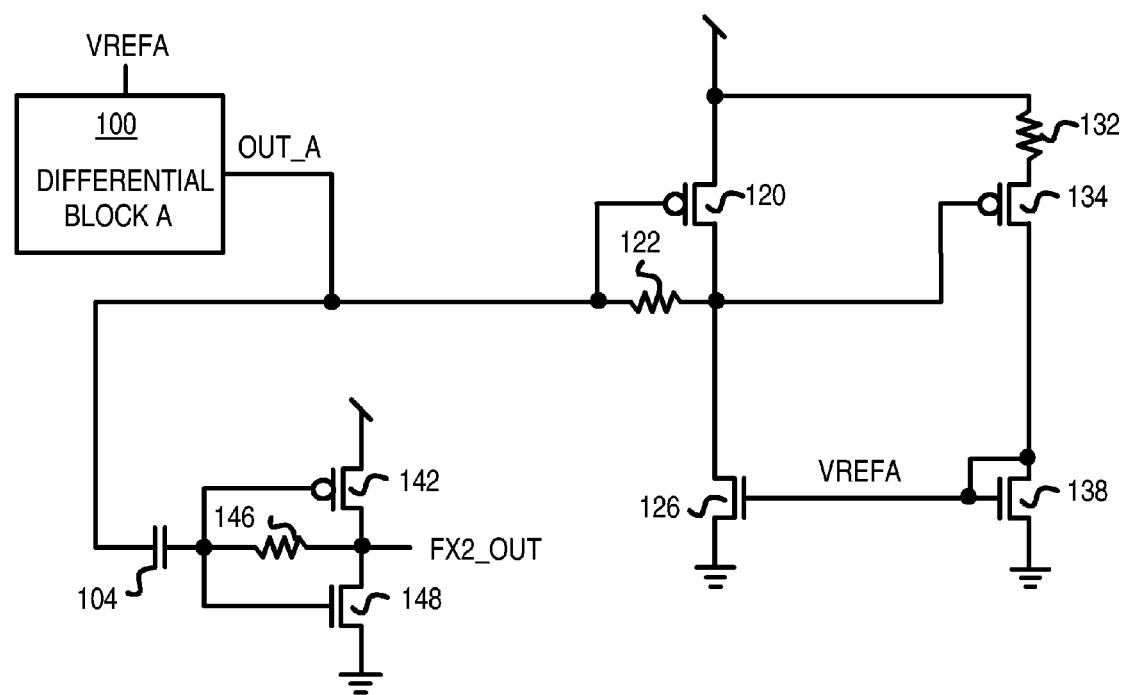
FIG. 6 is another variation used with the Colpitts oscillator.

FIG. 6 is another variation used with the Colpitts oscillator. The same differential core 100 of FIG. 4 is used, but a different output driver is used. Reference voltage VREFA is generated by the closed loop of transistors 120, 126, 134, 138.

Output FX2_OUT is driven by a push-pull driver of p-channel driver transistor 142 and n-channel driver transistor 148, both having their gates driven from OUT_A through DC-filtering capacitor 104. Gate-to-drain resistor 146 provides feedback from the output to the gates and biases the inverting amplifier formed by transistors 142, 148 to the highest gain linear region. This embodiment has the advantage of a more symmetrical output swing on FX2_OUT since both pull-up and pull-down drivers are used.

Figure 7:
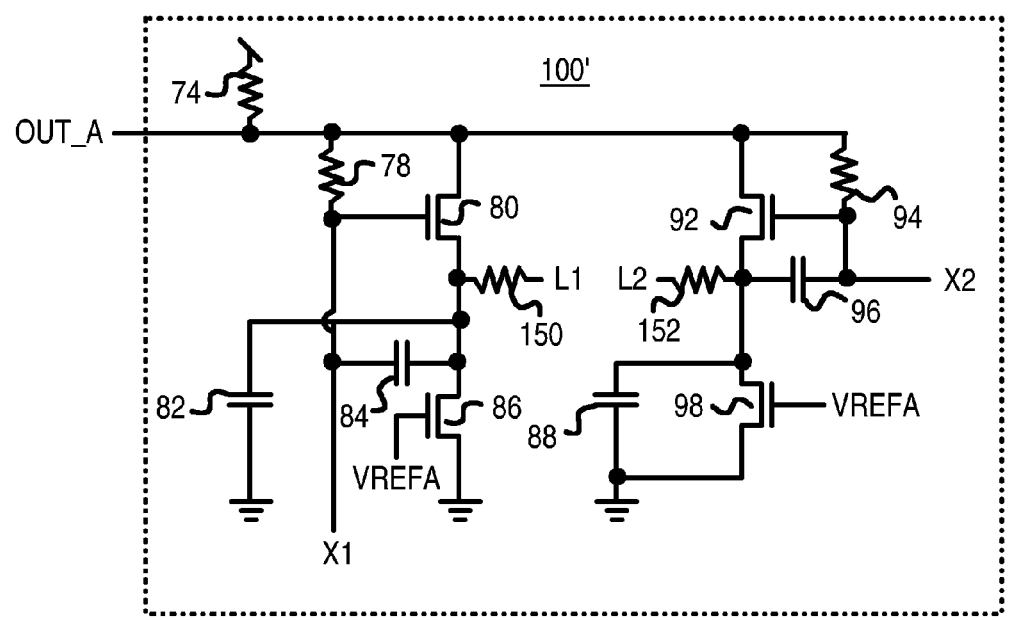
FIG. 7 is a variation of the differential core.

FIG. 7 is a variation of the differential core. Differential core 100' is similar to differential core 100 of FIG. 4, except for the addition of resistors 150, 152 and inductor 153 placed in series between the sources of differential transistors 80, 92. An external inductor may be used by routing terminals from resistors 150, 152 to external pins of an integrated circuit device.

Resistors 150, 152 and the inductor at L1-L2 (not shown) are analogous to resistor 90 in FIG. 4 between crystal nodes X1, X2. These components select the 3rd overtone of the crystal. This is a different method for crystal overtone selection. Theoretically, using an inductor should provide a higher-gain, lower phase-noise oscillator, since the third overtone is selected by filtering out the fundamental frequency instead of de-Quing.

Differential core 100' can be used with the biasing and output circuit of FIG. 6. Differential core 100' could also be used with the circuit of FIG. 5.

Figure 8:
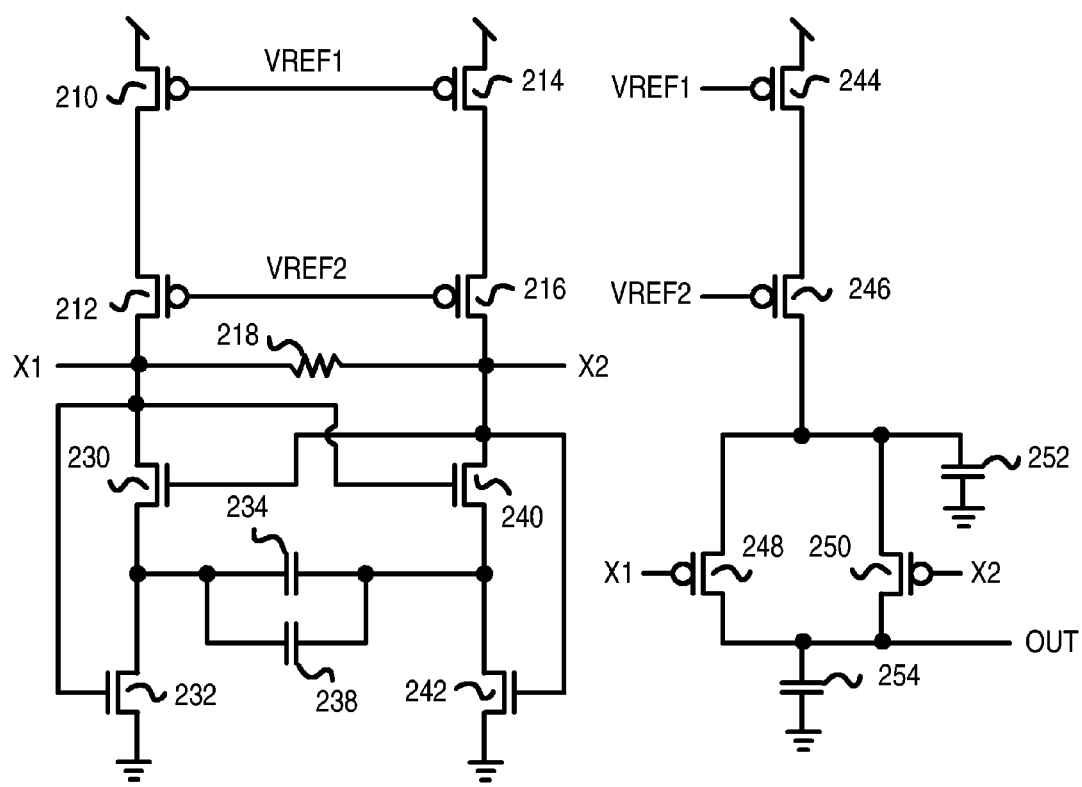
FIG. 8 is a differential oscillator circuit operating at the third overtone.

FIG. 8 is a differential oscillator circuit operating at the third overtone. This circuit is loosely based on a Pierce oscillator. A reference voltage VREF1 is applied to the gates of p-channel current-source transistors 210, 214, 244, while another reference voltage VREF2 is applied to the gates of second-level p-channel current-source transistors 212, 216, 246 which are in series with transistors 210, 214, 244, respectively. Reference voltages VREF1, VREF2 can be generated in a conventional manner, such as by voltage dividers.

Shunt resistor 218 is coupled between crystal nodes X1, X2, and has a resistance value designed to force the crystal (not shown) to operate at the third overtone rather than at the fundamental. For example, resistor 218 could be a 15 K-Ohm resistor. The value of shunt resistor 218 is chosen so that the absolute value of the product $gm \times (Xc1) \times (Xc2)$ is greater than the effective impedance of the crystal, where gm is the gain of each amplifier attached to nodes X1, X2, and Xc1 and Xc2 are the effective capacitive reactances of each phase shift leg node of each amplifier. Shunt resistor 218 effectively reduces the Q factor of the crystal for the fundamental frequency, while the 3rd overtone frequency has the required Q factor.

The crystal nodes are cross-coupled to the gates of n-channel upper differential transistors 230, 240, but straight-coupled to the gates of n-channel lower differential transistors 232, 242. For example, current sourced by p-channel transistors 210, 212 in series to crystal node X1 first passes through the channel of upper differential transistor 230 which has node X2 at its gate, and then through the channel of lower differential transistor 232 which has node X1 at its gate.

On the other side, for crystal node X2, current sourced by p-channel transistors 214, 216 in series to crystal node X2 first passes through the channel of upper differential transistor 240 which has node X1 at its gate, and then through the channel of lower differential transistor 242 which has node X2 at its gate.

The cross-coupling of the gates of upper differential transistors 230, 240 provides positive feedback to the other crystal node, enhancing oscillation of the crystal. Capacitors 234, 238 are coupled between the two circuit sides, between the drain of lower differential transistor 232 on one side and the drain of lower differential transistor 242 on the other side. Capacitors 234, 238 may be implemented as Poly2-to-Poly1 silicon dioxide capacitors, with a floating N-well placed beneath the capacitors to reduce their parasitic capacitances. Since the parasitic capacitor from Poly1 to substrate is higher than for Poly2, identical capacitors are used for a symmetrical capacitive loading on the source nodes of the differential cross-coupled transistors.

The value of capacitor 234 is the same as the value of capacitor 238. Capacitors 234, 238 the same, but the poly1 and poly2 connections are reversed, so that the source of capacitor 230 and the drain of capacitor 232 connect to poly1 of capacitor 234 but also to poly2 of capacitor 238.

The oscillator output is generated by a separate current source of p-channel transistors 244, 246 in series, which drive the sources of p-channel differential transistors 248, 250. Crystal node X1 is applied to the gate of p-channel differential transistor 248, while crystal node X2 is applied to the gate of p-channel differential transistor 250. The drains of p-channel differential transistors 248, 250 are connected together and drive output OUT and load capacitor 254 to ground. Source capacitor 252 can be added to the sources of p-channel differential transistors 248, 250.

P-channel transistors 210, 214, 212, and 216 act as cascode current sources to supply constant currents to n-channel cross-coupled transistors 240, 230. Drain-node outputs for each n-channel transistor are tied to the inputs of the opposite-side transistor to provide positive feedback during switching. Transistor 232, 242 are operating in the triode region as current followers forcing the current delivered by transistors 212, 216 across the cross-coupled pair. The two sources of the cross-coupled pair are DC separated and capacitively coupled at high frequencies by capacitors 234, 238.

The circuit structure yields positive feedback only above a given frequency and is thus DC stable. The impedance across nodes X1, X2 is determined by the transconductance (gm) of the cross-coupled pair, transistors 230, 240, resistor 218, capacitors 234, 238, and the loading capacitor across X1 and X2 (which is mainly the inherent capacitance C0 of the crystal). The real part of the impedance is represented by resistor 218, which is positive at low frequency and drops to negative value gain above a frequency set by the above parameters.

The cross-coupled pair of transistors 230, 240 acts as a latch during startup with an unbalanced operating point on nodes X1 and X2. The real part of impedance across X1 and X2 is set to a negative gain at the 3rd overtone frequency of the crystal that is placed between X1 and X2. The value of gm, resistor 218, and capacitors 234, 238 are tuned to suppress the oscillation for the fundamental frequency of crystal.

After startup, the 3rd overtone frequency is generated in differential at X1 and X2, and the differential signal is amplified and combined together by p-channel transistors 248, 250 at node OUT to generate 2 times the 3rd overtone frequency. An inductor, L, may be externally placed with a value selected to resonate with capacitor 254 at a frequency 6×F0, effectively forming a band-pass filter, reducing the sub-harmonic frequency (3rd overtone frequency) at the output.

Figure 9:
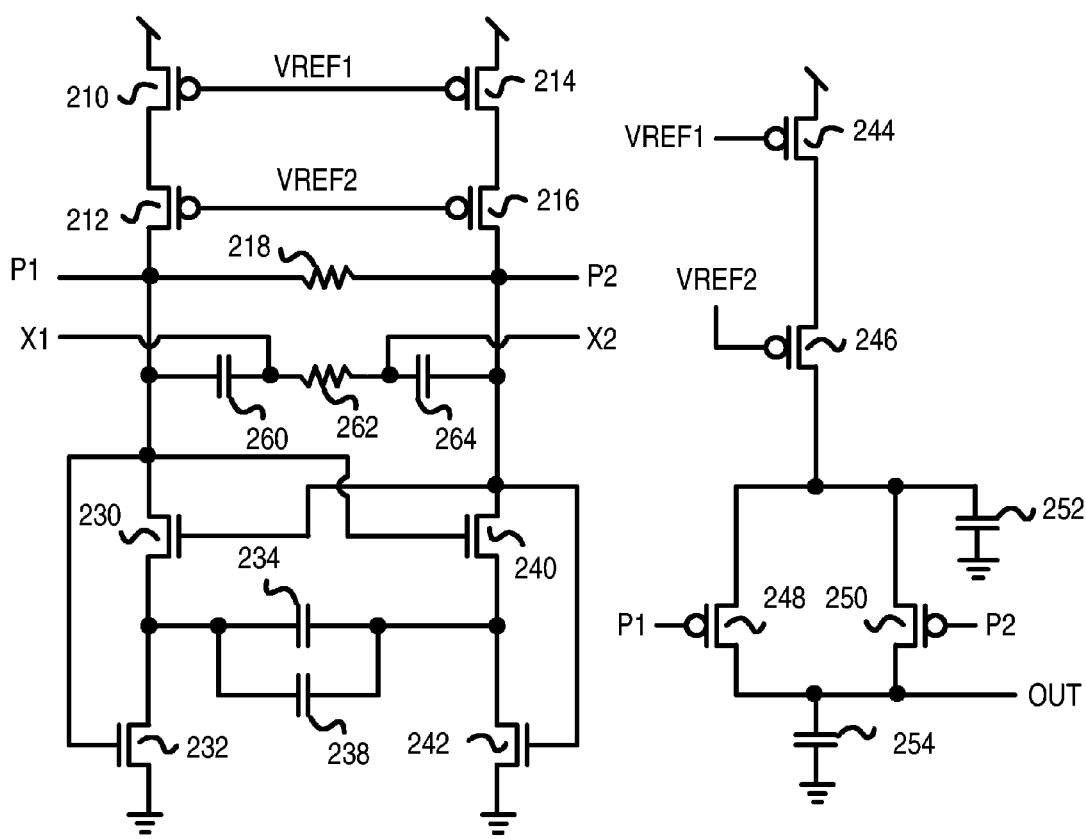
FIG. 9 is a modified oscillator circuit with capacitive isolation of oscillator nodes.

FIG. 9 is a modified oscillator circuit with capacitive isolation of oscillator nodes. Shunt resistor 262 is between crystal nodes X1, X2 and sets up oscillation at the third overtone as described before. However, AC-coupling capacitor 260 is inserted between crystal node X1 and circuit node P1. Likewise, AC-coupling capacitor 264 is inserted between crystal node X2 and circuit node P2. AC-coupling capacitors 260, 264 and resistor 262 reject the fundamental frequency of the crystal when the operating point at P1 and P2 happens to be balanced during a startup condition.

Capacitors 260, 264 can be 15 pF capacitors, while resistor 262 is a 3 K-Ohm resistor and resistor 218 is about a 9 K-Ohm resistor. Output capacitor 254 can be a 16 pF capacitor. Capacitors 234, 238 can be 2-4 pF capacitors.

Resistors 218 and 262 together act as shunt resistor 90. Resistor 218 acts as a de-Quing resistor while resistor 262 aids oscillator start-up. After capacitive coupling to nodes P1, P2, the oscillator has a similar structure and operates as described before for FIG. 8.

ALTERNATE EMBODIMENTS

Several other embodiments are contemplated by the inventors. For example a common base oscillator amplifier type could be employed. Outputs could be further buffered, and level-shifted to conform to various logic thresholds, such as low-voltage complementary metal-oxide-semiconductor (LVCMOS), low-voltage pseudo-emitter-coupled logic (LVPECL), low-voltage differential signaling (LVDS), or others. Mask or register programmability can be added. Stabilizing capacitors, resistors, inductors or other filters can be added to power and ground and other nodes. Multiple power and ground pads may be used. Current sources rather than voltage dividers can be used. Various alternative values of resistors, capacitors, and other components can be used. Additional filters could be added, such as to filter power or ground noise.

Different types of specific oscillator circuit configurations may be used, depending upon the 3 rd overtone frequency and performance required. For example, a Colpitts configuration may be used for 3 rd overtone up to 80 Mhz; and a Pierce configuration may be used for 3 rd overtone up to 125 Mhz.

Rather than operate on the third overtone, the crystal could operate at higher overtones. Transistor substrates can be tied to common buses, such as power or ground, or can be isolated in wells and tied to their sources, depending on the process used. For example, all n-channel transistor substrates could be connected together to ground in a common P-well, while p-channel transistors are formed in separate N-wells that are each biased by the transistor's source, or are connected to the power supply.

A divide-by-2 gate could be added before the final output driver. This may increase the overall end-product flexibility and applicability. Other circuit and product options could be added, as could test circuits.

The two halves of the oscillator circuit that connect to nodes X1, X2 should be as closely matched as possible, since a balanced circuit produces fewer unwanted distortions and requires less filtering. Careful layout of the transistors and components can reduce mis-matches and improve performance. For example, matching transistors can be laid out with the same orientation as well as the same dimensions. Signal trace wiring can be matched as closely as possible in length and geometry. Matching transistors can be laid out near to one another rather than on opposite sides of the die to minimize processing variations within a wafer.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A frequency multiplier circuit for generating at a circuit output node a circuit output signal having a frequency that is related to an oscillating frequency of a crystal, comprising:
   a first oscillator circuit coupled to a first node of the crystal and configured to generate at a first output node a first output signal having a first frequency that is substantially same as the oscillating frequency of the crystal;
   a second oscillator circuit coupled to a second node of the crystal and configured to generate at a second output node a second output signal having a second frequency that is substantially same as the first frequency, the second output signal being approximately 180 degree out of phase with the first output signal; and
   a summing device connected to the first and the second output nodes for generating the circuit output signal having a frequency that is substantially twice the oscillating frequency of the crystal.

2. The frequency multiplier circuit of claim 1 further comprising a filter for attenuating signals having a frequency of the oscillating frequency of the crystal but for passing signals having twice the oscillating frequency of the crystal.

3. The frequency multiplier circuit of claim 1 wherein at least one of the first and the second oscillator circuit comprises a Colpitts oscillator.

4. The frequency multiplier circuit of claim 1 wherein at least one of the first and the second oscillator circuit comprises a Pierce oscillator.

5. The frequency multiplier circuit of claim 1 wherein the summing device comprises a resistor for summing currents at the first and the second output nodes.

6. The frequency multiplier circuit of claim 1 wherein the first oscillator circuit comprises:
   a transistor having a base connected to the first node, an emitter connected to a phase-shift node, and a collector driving the first output signal;
   a resistor coupled between the phase-shift node and a ground;
   a first phase-shift capacitor coupled between the phase-shift node and the first node;
   a second phase-shift capacitor coupled between the phase-shift node and the ground; and
   a bias circuit for DC-biasing the transistor.

7. The frequency multiplier circuit of claim 1 wherein the first oscillator circuit comprises:
   a first transistor having a base connected to the first node, an emitter driving a first phase-shift node, and a collector driving the first output signal;
   a first resistor coupled between the first phase-shift node and a ground;
   a first phase-shift capacitor coupled between the first phase-shift node and the first node;
   a second phase-shift capacitor coupled between the first phase-shift node and the ground; and
   a first bias circuit for DC-biasing the first transistor;
   wherein the second oscillator circuit comprises:
   a second transistor having a base connected to the second node, an emitter connected to a second phase-shift node, and a collector driving the second output signal;
   a second resistor coupled between the second phase-shift node and the ground;
   a third phase-shift capacitor coupled between the second phase-shift node and the second node;
   a fourth phase-shift capacitor coupled between the second phase-shift node and the ground; and
   a second bias circuit for DC-biasing the second transistor; and
   wherein the summing device comprises:
   a third resistor having one end connected to the collectors of the first and the second transistors and another end connected to a power source.

8. The frequency multiplier circuit of claim 1 wherein the first oscillator circuit comprises:
   a first transistor having a gate connected to the first node and a channel between the first output node and a phase-shift node;
   a resistor coupled between the first output node and the gate;
   a first phase-shift capacitor coupled between the first node and the phase-shift node;
   a second transistor having a gate receiving a reference voltage and a channel between the phase-shift node and a ground; and
   a second phase-shift capacitor coupled between the phase-shift node and the ground.

9. The frequency multiplier circuit of claim 1 wherein the first oscillator circuit comprises:
   a first transistor having a gate connected to the first node and a channel between the first output node and a first phase-shift node;
   a first resistor coupled between the first output node and the first node;
   a first phase-shift capacitor coupled between the first node and the first phase-shift node;
   a second transistor having a gate receiving a first reference voltage and a channel between the first phase-shift node and a ground; and
   a second phase-shift capacitor coupled between the first phase-shift node and the ground;
   the second oscillator circuit comprises:
   a third transistor having a gate connected to the second node and a channel between the second output node and a second phase-shift node;
   a second resistor coupled between the second output node and the second node;
   a third phase-shift capacitor coupled between the second node and the second phase-shift node;
   a fourth transistor having a gate receiving a second reference voltage and a channel between the second phase-shift node and the ground; and
   a fourth phase-shift capacitor coupled between the second phase-shift node and the ground; and
   wherein the summing device comprises:
   a third resistor having one end connected to the first and the second output nodes and another end connected to a power source.

10. The frequency multiplier circuit of claim 9 further comprising:
    an AC-coupling capacitor having one end coupled to the first and the second output nodes and a second end; and
    an output transistor having a gate coupled to the second end and a drain driving the circuit output signal.

11. The frequency multiplier circuit of claim 10 further comprising:
    a gate pull-down resistor coupled between the second end and the ground;

a pull-up transistor having a gate receiving a third reference voltage; and a capacitor coupled between the drain and the power source.

12. The frequency multiplier circuit of claim 10 further comprising:

a pull-up output transistor having a gate connected to the second end and a drain driving the circuit output node; and a feedback resistor coupled between the drain node and the second end.

13. The frequency multiplier circuit of claim 1 wherein the first oscillator circuit comprises:

a first current source driving a current to the first node;

a first cross-coupled transistor having a gate connected to the second node and a channel between a first circuit node and the first node; and a first direct-coupled transistor having a gate connected to the first node and a channel between the first circuit node and a ground;

wherein the second oscillator circuit comprises:

a second current source driving a current to the second node;

a second cross-coupled transistor having a gate connected to the first node and a channel between a second circuit node and the second node; and a second direct-coupled transistor having a gate connected to the second node and a channel between the second circuit node and the ground; and wherein the summing device comprises:

a third current source driving a current to a third circuit node;

a first multiplier transistor having a gate connected to the first node and a channel between the third circuit node and the circuit output node; and a second multiplier transistor having a gate connected to the second node and a channel between the third circuit node and the circuit output node.

14. The frequency multiplier circuit of claim 13 wherein the first cross-coupled transistor is an n-channel transistor, wherein the first direct-coupled transistor is an n-channel transistor, wherein the second cross-coupled transistor is an n-channel transistor, wherein the second direct-coupled transistor is an n-channel transistor, wherein the first multiplier transistor is a p-channel transistor, and wherein the second multiplier transistor is a p-channel transistor.

15. The frequency multiplier circuit of claim 13 wherein the summing device further comprises an additional capacitor coupled between the third circuit node and the ground.

16. The frequency multiplier circuit of claim 13 wherein the first current source comprises:

a first cascode transistor having a gate receiving a first bias voltage; and a second cascode transistor having a gate receiving a second bias voltage;

wherein the first cascode transistor and the second cascode transistor have channels in series between a power supply and the first node; and wherein the second current source comprises:

a third cascode transistor having a gate receiving the first bias voltage; and a fourth cascode transistor having a gate receiving the second bias voltage;

wherein the third cascode transistor and the fourth cascode transistor have channels in series between the power supply and the second node.

17. The frequency multiplier circuit of claim 13 further comprising:

a first capacitor coupled in a forward layout connection between the first circuit node and the second circuit node, wherein a positive terminal is connected to the first circuit node and a negative terminal is connected to the second circuit node; and a second capacitor coupled in a reverse layout connection between the first circuit node and the second circuit node wherein a positive terminal is connected to the second circuit node and a negative terminal is connected to the first circuit node;

wherein the first capacitor and the second capacitor have substantially same capacitance value between the first circuit node and the second circuit node but have different parasitic capacitances to the ground for the positive terminal and for the negative terminal.

* * * * *